(12) United States Patent
Kawashima

(10) Patent No.: US 8,125,009 B2
(45) Date of Patent: Feb. 28, 2012

(54) MOUNTING CIRCUIT SUBSTRATE

(75) Inventor: Keiichi Kawashima, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 94 days.

(21) Appl. No.: 12/837,618

(22) Filed: Jul. 16, 2010

(65) Prior Publication Data

US 2011/0079877 A1  Apr. 7, 2011

(30) Foreign Application Priority Data

Oct. 6, 2009  (JP) .................. 2009-232638

(51) Int. Cl.
*H01L 29/78* (2006.01)
*H01L 23/48* (2006.01)
(52) U.S. Cl. ... 257/288; 257/728; 257/773; 257/E23.07; 257/E29.255
(58) Field of Classification Search .................. 257/288, 257/368, 532, 728, 773, E23.06, E23.07, 257/E29.255
See application file for complete search history.

(56) References Cited

U.S. PATENT DOCUMENTS 5,635,759 A  6/1997  Negishi
(Continued)

FOREIGN PATENT DOCUMENTS

| JP | 1-273404 A | 11/1989 |
| JP | 4-288860 A | 10/1992 |
| JP | 5-166960 A | 7/1993 |
| JP | 5-218231 A | 8/1993 |

(Continued)

*Primary Examiner* — Tuan N. Quach
(74) *Attorney, Agent, or Firm* — Leydig, Voit & Mayer, Ltd.

(57) ABSTRACT

A semiconductor package containing a field effect transistor (FET) used in a high frequency band includes a mounting circuit substrate on which the semiconductor device is mounted. The mounting circuit substrate has a gate wiring conductor, a drain wiring conductor, and a source wiring conductor, which are connected to the gate electrode, the drain electrode, and the source electrode, respectively, of the semiconductor device. The gate wiring conductor and the drain wiring conductor extend toward each other so that their adjacent or facing ends are in close proximity to each other, thereby increasing the capacitance between the gate wiring conductor and the drain wiring conductor.

7 Claims, 4 Drawing Sheets

U.S. PATENT DOCUMENTS

| | | | |
|---|---|---|---|
| 6,049,126 A * | 4/2000 | Saitoh | 257/728 |
| 6,737,687 B2 * | 5/2004 | Baba et al. | 257/276 |
| 6,900,537 B2 * | 5/2005 | Sridevan | 257/728 |
| 7,087,977 B2 * | 8/2006 | Nakayama et al. | 257/532 |
| 7,851,884 B2 * | 12/2010 | Asai et al. | 257/523 |
| 2010/0109052 A1 * | 5/2010 | Nakajima et al. | 257/197 |

FOREIGN PATENT DOCUMENTS

| | | |
|---|---|---|
| JP | 6-61365 A | 3/1994 |
| JP | 6-69245 A | 3/1994 |
| JP | 8-139107 A | 5/1996 |
| JP | 2001-274285 A | 10/2001 |
| JP | 2001-284490 A | 10/2001 |

* cited by examiner

MOUNTING CIRCUIT SUBSTRATE

FIELD OF THE INVENTION

The present invention relates to a mounting circuit substrate, and more particularly to a mounting circuit substrate on which a high frequency semiconductor device is mounted.

BACKGROUND ART

Various techniques for high frequency applications have been known, as disclosed, for example, in Japanese Laid-Open Patent Publication Nos. 8-139107 (1996), 6-61365 (1994), and 1-273404 (1989).

In high frequency applications, the electrical characteristics of the semiconductor devices are significantly affected by their operating frequency, which may cause various problems. In order to address such problems, different techniques have been studied, including those disclosed in the above three publications. Specifically, the first publication discloses a semiconductor device package construction, the second publication discloses a semiconductor chip mounting method, and the third publication discloses the construction of a high frequency circuit including matching circuits.

High frequency semiconductor devices are generally mounted on mounting circuit substrates when used in practical applications. Each portion of a mounting circuit substrate (e.g., wiring patterns) usually has a configuration determined in accordance with the specifications of the semiconductor device to be mounted on the substrate.

A problem associated with high frequency semiconductor devices is that the power gain decreases as the operating frequency increases. In this connection, the present inventor has found that there is still room for improvement in the construction of mounting circuit substrates to improve the high frequency characteristics of the semiconductor device mounted thereon.

SUMMARY OF THE INVENTION

The present invention has been made to solve the above problems. It is, therefore, an object of the present invention to provide a mounting circuit substrate on which a high frequency semiconductor device is mounted and which is configured to improve the power gain characteristics of the high frequency semiconductor device.

According to a first aspect of the present invention, amounting circuit substrate including: a substrate body, a gate wiring conductor and a drain wiring conductor.

The substrate body has a surface having a mounting region on which a high frequency semiconductor device is mounted.

The gate wiring conductor has a connecting portion at which the gate wiring conductor is electrically connected to a gate electrode of the high frequency semiconductor device, the connecting portion being located in the mounting region of the substrate body.

The drain wiring conductor has a connecting portion at which the drain wiring conductor is electrically connected to a drain electrode of the high frequency semiconductor device, the connecting portion being located in the mounting region of the substrate body and spaced a predetermined distance from an edge of the connecting portion of the gate wiring conductor.

A capacitance between the connecting portion of the gate wiring conductor and the connecting portion of the drain wiring conductor resonates with the LC components in the high frequency semiconductor device so that the power gain vs. frequency characteristic curve of the high frequency semiconductor device has a hump at a frequency in the operating frequency band of the high frequency semiconductor device.

Thus, the mounting circuit substrate of the present invention is configured such that the capacitance between the gate and drain wiring conductors resonates with the LC components in the high frequency semiconductor device mounted on the substrate, thereby improving the power gain of the device.

DETAILED DESCRIPTION OF THE PREFERRED EMBODIMENTS

First Embodiment

Figure 1:
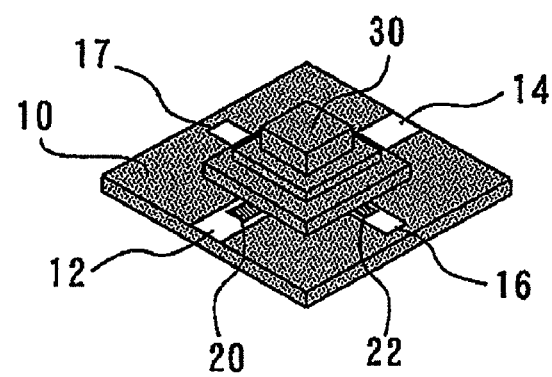
FIG. 1 is a perspective view of a mounting circuit substrate according to a first embodiment of the present invention and a semiconductor device mounted thereon.

FIG. 1 is a perspective view of a mounting circuit substrate 10 according to a first embodiment of the present invention and a semiconductor device 30 mounted thereon. The semiconductor device 30 is a semiconductor package containing a field effect transistor (FET) and more specifically is a high frequency semiconductor device used in a high frequency band. The mounting circuit substrate 10 is a mounting circuit substrate for use with a high frequency semiconductor device and is adapted to have the semiconductor device 30 mounted thereon. The mounting circuit substrate 10 has a gate wiring conductor 12, a drain wiring conductor 14, and a source wiring conductor 16, which are connected to a gate electrode 20, a drain electrode 24, and source electrodes 22 and 23, respectively, of the semiconductor device 30. When the gate and drain electrodes of the semiconductor device 30 are used as input and output electrodes, respectively, the gate wiring conductor 12 and the drain wiring conductor 14 of the mounting circuit substrate 10 serve as input and output wiring conductors, respectively.

Figure 2:
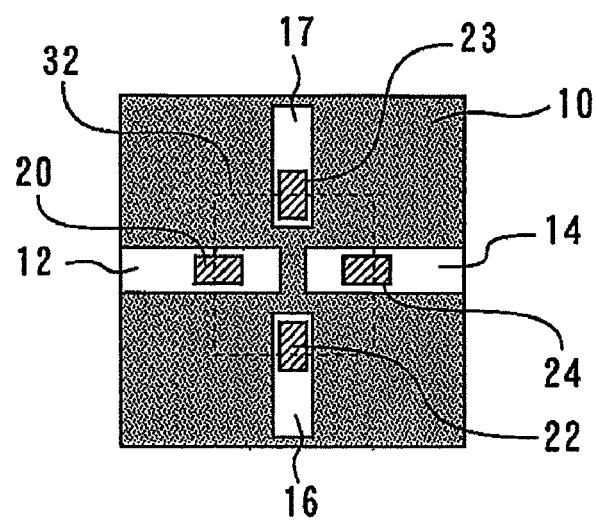
FIG. 2 is a plan view showing the surface configuration of the mounting circuit substrate of the first embodiment.

FIG. 2 is a plan view showing the surface configuration of the mounting circuit substrate 10 of the first embodiment as viewed through the semiconductor device 30 (i.e., without showing the semiconductor device 30 except for its electrodes). In FIG. 2, the dashed line 32 schematically indicates the region of the substrate surface on which the semiconductor device 30 is mounted. This region, enclosed within and defined by the dashed line 32, is hereinafter referred to as the "mounting region 32," for convenience. In FIG. 2, the gate electrode 20, the source electrodes 22 and 23, and the drain electrode 24 of the semiconductor device 30 are shown to partially overlap the mounting region 32.

Figure 3:
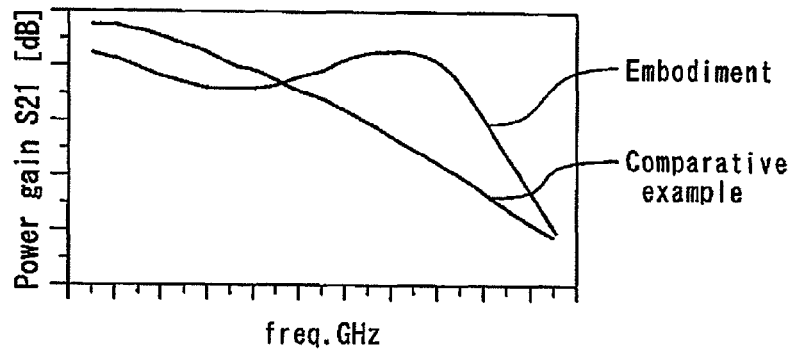
FIG. 3 is a diagram illustrating the effect of the construction of the mounting circuit substrate.
Figure 8:
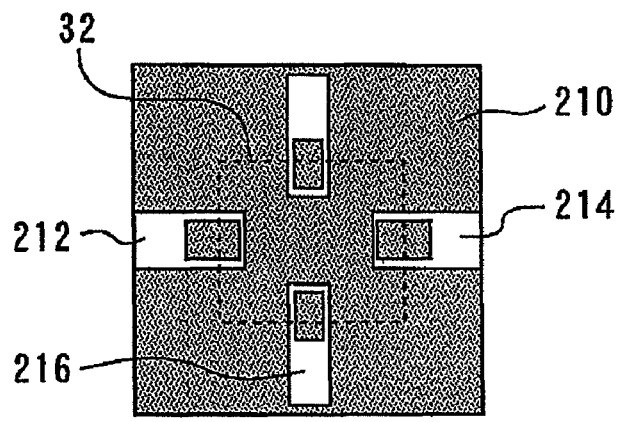
FIG. 8 shows a configuration of a comparative example.
Figure 9:
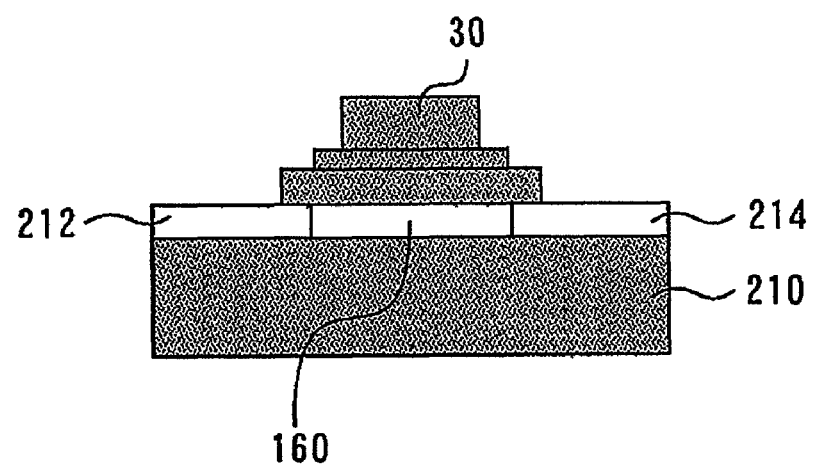
FIG. 9 shows a configuration of a comparative example.

The following describes the characteristic construction of the mounting circuit substrate 10 of the first embodiment and the effect resulting from this construction with reference to FIGS. 1 to 3 and with reference to the construction of the comparative mounting circuit substrate 210 shown in FIGS. 8 and 9, for convenience. The comparative mounting circuit substrate 210 shown in FIGS. 8 and 9 has a gate wiring conductor 212, a source wiring conductor 216, and a drain wiring conductor 214. The comparative substrate 210 is similar to the mounting circuit substrate 10 in this respect (i.e., having gate, source, and drain wiring conductors). However, the distance between the facing or adjacent ends of the gate wiring conductor 212 and the drain wiring conductor 214 is greater than that between the facing or adjacent ends of the gate wiring conductor 12 and the drain wiring conductor 14 of the mounting circuit substrate 10. It should be noted that FIG. 9 is a cross-sectional view of the comparative substrate 210 of FIG. 8 taken in a plane perpendicular to the plane of the paper. However, the source electrode 22, etc. of the semiconductor device 30 are omitted from FIG. 9 for convenience of illustration. In FIG. 9, the reference numeral 160 denotes a cavity containing air.

FIG. 3 is a diagram illustrating the effect of the construction of the mounting circuit substrate 10. Specifically, FIG. 3 shows the power gain (S21 in dB) vs. frequency characteristics (or RF characteristics) of the semiconductor device 30 when it is mounted on the mounting circuit substrate 10 of the present embodiment and when it is mounted on the comparative substrate 210 shown in FIGS. 8 and 9. As shown in FIG. 3, the power gain (S21) of the semiconductor device 30 mounted on the comparative substrate 210 gradually decreases as its operating frequency increases. In the case of the mounting circuit substrate 10 of the present embodiment, on the other hand, the power gain (S21) of the semiconductor device 30 mounted thereon does not substantially decrease as its operating frequency increases; the power gain curve shows a hump at a frequency in a high frequency band. Thus, the power semiconductor device 30 exhibits improved power gain characteristics at high frequencies when it is mounted on the mounting circuit substrate 10 as compared to when it is mounted on the comparative substrate 210.

The prevent inventor has found that this improvement in the power gain characteristics of the semiconductor device at high frequencies results from the fact that the substrate-side capacitance of the mounting circuit substrate 10 is greater than that of the comparative substrate 210. Therefore, the inventor has further studied the power gain increasing effect of such substrate constructions (which effect is represented by a hump in the power gain curve of the semiconductor device) in order to improve the characteristics of the semiconductor device.

This hump in the power gain curve results from the resonance of the LC components in the semiconductor device 30 with the capacitance components of the wiring conductors on the mounting circuit substrate 10. That is, the term "substrate-side capacitance" as used above means the capacitance components of the wiring conductors on the mounting circuit substrate 10 as seen by the semiconductor device. The present inventor has found, through experiment, that the hump in the power gain curve is predominantly affected or determined by the capacitance between the gate and drain wiring conductors although the capacitance between the gate and source wiring conductors and that between the drain and source wiring conductors are consider to have some impact. It should be noted that the term "LC components in the semiconductor device" as used above means the inductance and capacitance components of the parts (e.g., transistors, wires, leads, etc.) in the semiconductor device 30. These LC components are significantly large at the high frequencies at which the semiconductor device operates. Therefore, the substrate-side capacitance of the mounting circuit substrate 10 may be adjusted in accordance with the values of the LC components of the semiconductor device 30 to intentionally produce a hump in the power gain curve of the semiconductor device 30 at a frequency in the desired frequency band and thereby improve the power gain characteristics as desired. This method allows the power gain characteristics of the semiconductor device 30 to be improved by changing the configuration of the mounting circuit substrate 10 without changing the semiconductor device structure or package structure of the semiconductor device 30.

As described above, the substrate-side capacitance is predominantly affected or determined by the capacitance between the gate wiring conductor 12 and the drain wiring conductor 14 of the mounting circuit substrate 10. Therefore, to obtain the desired power gain characteristics of the semiconductor device 30, the substrate-side capacitance may be optimized by changing the configurations of the gate wiring conductor 12 and the drain wiring conductor 14 of the mounting circuit substrate 10.

In the first embodiment, the gate wiring conductor 12 and the drain wiring conductor 14 extend toward each other so that their adjacent or facing ends are in close proximity to each other, as shown in FIG. 1, thereby increasing the capacitance between the gate wiring conductor 12 and the drain wiring conductor 14. In conventional mounting circuit substrates such as the comparative substrate 210, the gate and drain wiring conductors extend to under the gate and drain electrodes, respectively, of the semiconductor device so that their adjacent or facing ends are located right under (and in contact with) these electrodes, respectively. In the mounting circuit substrate 10 of the first embodiment, on the other hand, the gate wiring conductor 12 and the drain wiring conductor 14 extend beyond (and contact with) the gate electrode 20 and the drain electrode 24, respectively, of the semiconductor device 30, as shown in FIG. 2.

In the present embodiment shown in FIG. 2, two source wiring conductors are disposed on opposite sides of an imaginary line extending along the lengths of the gate and drain wiring conductors so that these source wiring conductors have facing ends. In this configuration, the distance between the gate and drain wiring conductors is smaller than that between the source wiring conductors.

The following should be noted: the mounting region 32 of the first embodiment described above corresponds to the mounting region of the invention described in the Summary of the Invention section; the gate wiring conductor 12 corresponds to the gate wiring conductor of the invention; and the drain wiring conductor 14 corresponds to the drain wiring conductor of the invention.

It should be noted that although in the first embodiment the mounting circuit substrate has four wiring conductors extending on its mounting region 32, it is to be understood that the present invention is not limited to this particular arrangement. In other embodiments, the mounting circuit substrate may have any suitable number of wiring conductors disposed in any suitable arrangement (i.e., not limited to a symmetrical arrangement such as shown in FIG. 2). Further, the widths and shapes of these wiring conductors may not be uniform as shown in FIG. 2.

Second Embodiment

In the mounting circuit substrate of the first embodiment, the gate wiring conductor 12 and the drain wiring conductor 14 extend toward each other so that their adjacent or facing ends are in close proximity to each other, thus increasing the capacitance between the gate wiring conductor 12 and the drain wiring conductor 14. In addition to this arrangement, the capacitance between the gate wiring conductor 12 and the drain wiring conductor 14 may be further increased by increasing the electrode facing area (or the area of overlap of the gate and drain wiring conductors). The mounting circuit substrate of a second embodiment of the present invention differs from that of the first embodiment in that it has a larger electrode facing area to further improve the power gain of the semiconductor device.

The term "electrode facing area" as used herein means the area of overlap of the facing portions (or facing ends) of the gate and drain wiring conductors. The capacitance C between the gate and drain wiring conductors may be expressed as $C=\in *S/d$, where S is the electrode facing area, $\in$ is the dielectric constant of the material between the facing portions of the gate and drain wiring conductors, and d is the distance between the facing portions. Since the gate and drain wiring conductors are located on the mounting circuit substrate 10, these wiring conductors are separated by air. Therefore, in this case, $\in$ may be assumed to be equal to the dielectric constant of air for simplicity, although the dielectric constant of the substrate body of the mounting circuit substrate 10 has a significant impact on the value of $\in$. Further, the construction of the second embodiment is similar to that of the first embodiment, except for the configurations of the gate and drain wiring conductors.

Figure 4:
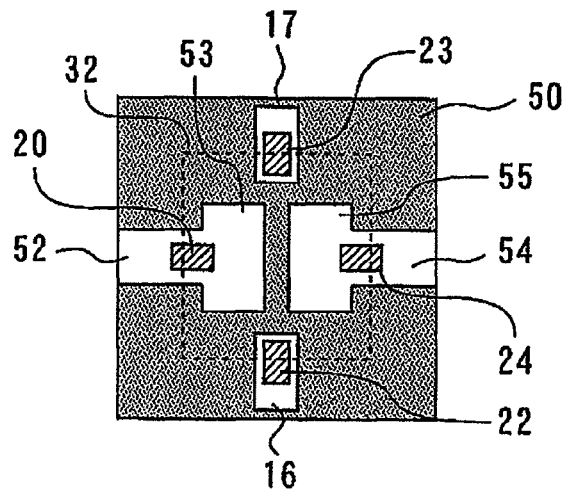
FIG. 4 is a plan view showing the configuration of a mounting circuit substrate according to the second embodiment of the present invention.

FIG. 4 is a plan view showing the configuration of a mounting circuit substrate 50 according to the second embodiment of the present invention. In the second embodiment, the gate wiring conductor 52 has a wide portion 53 and the drain wiring conductor 54 has a wide portion 55, thereby increasing the electrode facing area and hence the capacitance between the gate wiring conductor 52 and the drain wiring conductor 54.

It should be noted that although in the second embodiment the wide portions 53 and 55 are rectangular in shape, it is to be understood that the present invention is not limited to this particular shape. In other embodiments, the wide portions may widen gradually or stepwise toward the facing edges.

Third Embodiment

Figure 5:
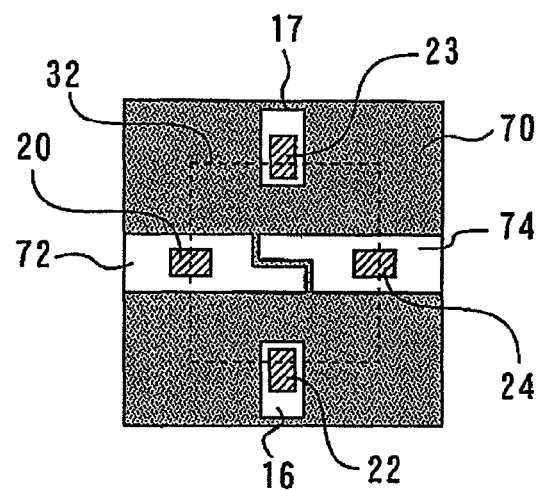
FIG. 5 is a plan view showing the configuration of a mounting circuit substrate according to the third embodiment of the present invention.

FIG. 5 is a plan view showing the configuration of a mounting circuit substrate 70 according to a third embodiment of the present invention. The mounting circuit substrate 70 of the third embodiment has its electrode facing area increased in a different manner than that described in connection with the second embodiment. Specifically, in the third embodiment, the facing ends of the gate wiring conductor 72 and the drain wiring conductor 74 have a dogleg shape, as shown in FIG. 5, resulting an increase in the facing areas of the gate wiring conductor 72 and the drain wiring conductor 74. The gate wiring conductor 72 and the drain wiring conductor 74 shown in FIG. 5 may be regarded as having both convex and concave portions.

Fourth Embodiment

Figure 6:
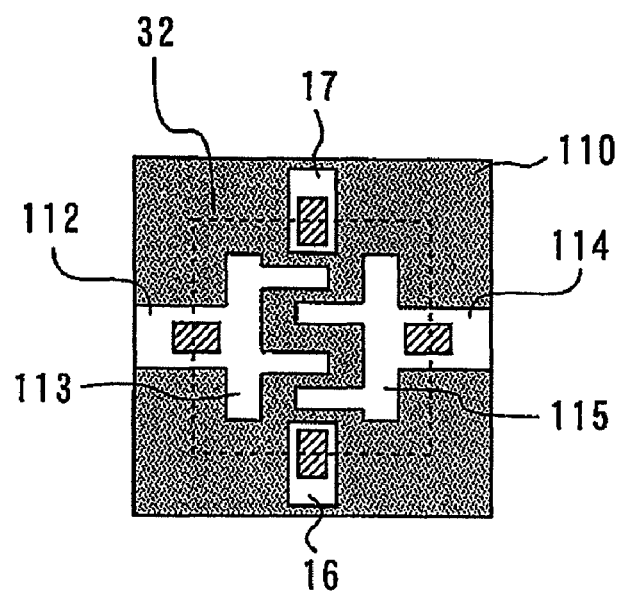
FIG. 6 is a plan view showing the configuration of a mounting circuit substrate according to the fourth embodiment of the present invention.

FIG. 6 is a plan view showing the configuration of a mounting circuit substrate 110 according to a fourth embodiment of the present invention. The mounting circuit substrate 110 of the fourth embodiment has its electrode facing area increased in a different manner than those described in connection with the second and third embodiments. Specifically, in the fourth embodiment, the gate wiring conductor 112 has a comb portion 113 and the drain wiring conductor 114 has a comb portion 115, as shown in FIG. 6. This results in an increase in the facing areas of the gate wiring conductor 112 and the drain wiring conductor 114, since the comb portion 113 of the gate wiring conductor 112 is interdigitated with the comb portion 115 of the drain wiring conductor 114.

It should be noted that although in the fourth embodiment the comb portions 113 and 115 each have two teeth and these teeth are interdigitated with each other, it is to be understood that the present invention is not limited to this particular arrangement. The interdigitated comb portions may have more teeth. Further, although in the present embodiment the teeth of the comb portions are rectangular in shape, in other embodiments they may be of a triangular or curved shape and may still be interdigitated with each other. This also results in an increase in the facing areas of the gate wiring conductor 112 and the drain wiring conductor 114.

Fifth Embodiment

Figure 7:
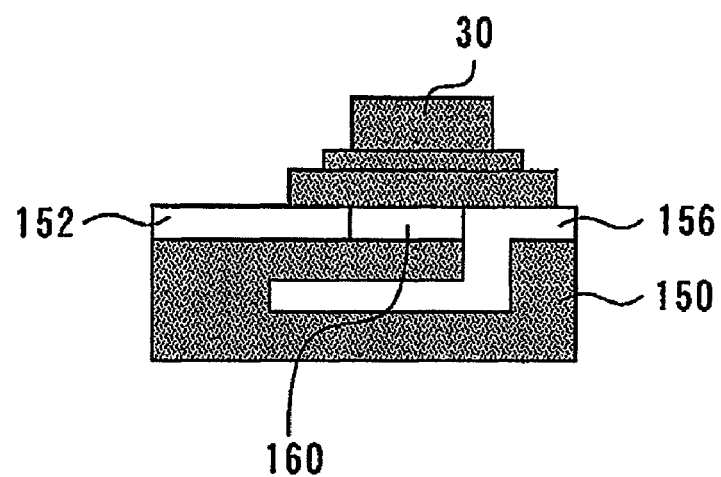
FIG. 7 is a cross-sectional view showing the configuration of a mounting circuit substrate according to a fifth embodiment of the present invention.

FIG. 7 is a cross-sectional view showing the configuration of a mounting circuit substrate 150 according to a fifth embodiment of the present invention. Thus, FIG. 7 shows a cross-section corresponding to those of the mounting circuit substrates of FIGS. 2 to 6 taken in a plane perpendicular to the plane of FIGS. 2 to 6. It should be noted that the source electrode 22, etc. of the semiconductor device 30 are omitted from FIG. 7 for convenience of illustration.

The mounting circuit substrate 150 of the fifth embodiment has its electrode facing area increased in a different manner than those described in connection with the second and fourth embodiments. Specifically, in the fifth embodiment, the drain wiring conductor 154 extends within the substrate under and along the gate wiring conductor 152, as shown in FIG. 7. Thus, the gate wiring conductor 152 and the drain wiring conductor 154 are spaced only a short distance from each other in the direction of the thickness of the substrate, thereby increasing the electrode facing area (i.e., the area of overlap of the gate wiring conductor 152 and the drain wiring conductor 154). It should be noted that the reference numeral 160 denotes a cavity containing air. Further, in the mounting circuit substrate 150 of the fifth embodiment, the material of the substrate body fills the space between the gate wiring conductor 152 and the drain wiring conductor 154. Therefore, in the fifth embodiment, the capacitance C between the gate and drain wiring conductors may be expressed as $C=\in *S/d$, where S is the electrode facing area, d is the distance between the facing portions of the gate and drain wiring conductors, and $\in$ is the dielectric constant of the material of the substrate body (or base material) of the mounting circuit substrate 150.

It will be noted that in the fifth embodiment the drain wiring conductor 154 extends within the substrate body of the mounting circuit substrate 150 such that the gate wiring conductor 152 overlaps, without contacting, the drain wiring conductor 154 when viewed from the top surface of the mounting circuit substrate 150.

It should be noted that the configuration of the fifth embodiment may be combined with the configurations of the first to fourth embodiments.

Obviously many modifications and variations of the present invention are possible in the light of the above teachings. It is therefore to be understood that within the scope of the appended claims the invention may by practiced otherwise than as specifically described.

The entire disclosure of a Japanese Patent Application No. 2009-232638, filed on Oct. 6, 2009 including specification, claims, drawings and summary, on which the Convention priority of the present application is based, are incorporated herein by reference in its entirety.

What is claimed is:

1. A circuit comprising:
    a high frequency semiconductor device having a gate electrode, a source electrode, and a drain electrode;
    a substrate body having a top surface having a mounting region on which said high frequency semiconductor device is mounted;
    a gate wiring conductor having a connecting portion at which said gate wiring conductor is electrically connected to said gate electrode of said high frequency semiconductor device, said connecting portion of said gate wiring conductor being located in said mounting region of said substrate body; and
    a drain wiring conductor having a connecting portion at which said drain wiring conductor is electrically connected to said drain electrode of said high frequency semiconductor device, said connecting portion of said drain wiring conductor being located in said mounting region of said substrate body and spaced a predetermined distance from an edge of said connecting portion of said gate wiring conductor, wherein capacitance between said connecting portion of said gate wiring conductor and said connecting portion of said drain wiring conductor resonates with reactive electrical components of said high frequency semiconductor device so that power gain as a function of frequency of said high frequency semiconductor device has a hump at a frequency in an operating frequency band of said high frequency semiconductor device.

2. The circuit according to claim 1, further comprising:
    a first source wiring conductor having a connecting portion at which said first source wiring conductor is electrically connected to said source electrode of said high frequency semiconductor device, said connecting portion of said first source wiring conductor being located in said mounting region of said substrate body; and
    a second source wiring conductor having a connecting portion at which said second source wiring conductor is electrically connected to said source electrode of said high frequency semiconductor device, said connecting portion of said second source wiring conductor being located in said mounting region of said substrate body and facing said connecting portion of said first source wiring conductor across an imaginary line that extends from said connecting portion of said gate wiring conductor to said connecting portion of said drain wiring conductor, wherein distance between said edge of said connecting portion of said gate wiring conductor and an adjacent edge of said connecting portion of said drain wiring conductor is smaller than distance between said first and second source wiring conductors.

3. The circuit according to claim 1, wherein a facing portion of said gate wiring conductor faces a facing portion of said drain wiring conductor, and at least one of said facing portions of said gate and drain wiring conductors has a widened portion.

4. The circuit according to claim 1, wherein:
    a facing portion of said connecting portion of said gate wiring conductor faces a facing portion of said connecting portion of said drain wiring conductor; and
    one of said facing portions of said connecting portions of said gate and drain wiring conductors has a convex portion, and the other of said facing portions has a concave portion corresponding to said convex portion.

5. The circuit according to claim 4, wherein said facing portions of said connecting portions of said gate and drain wiring conductors include one of comb portions and dogleg portions interdigitated or engaged with each other.

6. The circuit according to claim 1, wherein one of said gate and drain wiring conductors includes an internal wiring conductor portion connected to said connecting portion of one of said gate and drain wiring conductors and extending within said substrate body toward the other of said gate and drain wiring conductors.

7. The circuit according to claim 6, wherein said internal wiring conductor portion extends within said substrate body toward said other of said gate and drain wiring conductors such that said connecting portion of said other of said gate and drain wiring conductors overlaps, without contacting, said internal wiring conductor portion when viewed from said top surface of said substrate body.

* * * * *